(12) United States Patent
Ahn et al.

(10) Patent No.: US 7,282,761 B2
(45) Date of Patent: Oct. 16, 2007

(54) SEMICONDUCTOR MEMORY DEVICES HAVING OFFSET TRANSISTORS AND METHODS OF FABRICATING THE SAME

(75) Inventors: Su-jin Ahn, Seoul (KR); Se-ho Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 353 days.

(21) Appl. No.: 10/696,615

(22) Filed: Oct. 28, 2003

(65) Prior Publication Data

US 2004/0084698 A1   May 6, 2004
US 2005/0029559 A9   Feb. 10, 2005

(30) Foreign Application Priority Data

Oct. 29, 2002   (KR) .................... 10-2002-0066086

(51) Int. Cl.
*H01L 29/792* (2006.01)
(52) U.S. Cl. ...................... 257/329; 257/321
(58) Field of Classification Search ................ 257/316, 257/317, 321, 309, E27.054, E27.096, E29.183, 257/E29.189
See application file for complete search history.

(56) References Cited

U.S. PATENT DOCUMENTS

| | | | |
|---|---|---|---|
| 5,604,357 A | * | 2/1997 | Hori ............................ 257/24 |
| 5,952,692 A | | 9/1999 | Nakazato et al. |
| 6,169,308 B1 | | 1/2001 | Sunami et al. |
| 6,211,531 B1 | * | 4/2001 | Nakazato et al. ............. 257/28 |
| 6,635,921 B2 | * | 10/2003 | Yi et al. ..................... 257/316 |

* cited by examiner

*Primary Examiner*—Sara Crane
(74) *Attorney, Agent, or Firm*—Myers Bigel Sibley & Sajovec (57) ABSTRACT

Semiconductor memory devices are provided that comprise unit memory cells. The unit memory cells include a first planar transistor in a semiconductor substrate, a vertical transistor disposed on the first planar transistor and a second planar transistor in series with the first planar transistor. The first planar transistor and the second planar transistor may have different threshold voltages. The semiconductor memory device may further include word lines. One of these word lines may form the gate of the second planar transistor a unit memory cell.

21 Claims, 13 Drawing Sheets

Fig. 1

(PRIOR ART)

Fig. 2

(PRIOR ART)

SEMICONDUCTOR MEMORY DEVICES HAVING OFFSET TRANSISTORS AND METHODS OF FABRICATING THE SAME

CROSS REFERENCE TO RELATED APPLICATIONS

This application claims priority under 35 U.S.C. § 119 to Korean Patent Application No. 2002-66086, filed Oct. 29, 2002, the contents of which are incorporated herein in its entirety by reference.

FIELD OF THE INVENTION

The present invention generally relates to semiconductor devices and more specifically, to semiconductor memory devices and associated methods of fabrication.

BACKGROUND OF THE INVENTION

DRAM semiconductor memory devices generally have a higher density of integration than do SRAM semiconductor memory devices. However, DRAM memory devices require that a refresh operation be periodically performed in order to prevent data loss and thus DRAM memory devices consume power even when in a stand-by mode. It is not necessary to perform a refresh process with nonvolatile memory devices such as a flash memory devices. However, nonvolatile memory devices may require a higher voltage to perform a write operation.

In order to overcome the drawbacks of DRAM memory devices and nonvolatile memory devices, semiconductor memory devices using multi-tunnel junction patterns are suggested as disclosed, for example, in U.S. Pat. No. 5,952,692, entitled "Memory Device With Improved Charge Storage Barrier Structure" and U.S. Pat. No. 6,169,308, entitled "Semiconductor Memory Device And Manufacturing Method Thereof." An example of a semiconductor memory device that uses multi-tunnel junction patterns is shown FIGS. 1 and 2, which are a cross-sectional view and a circuit diagram thereof, respectively.

Figure 1:
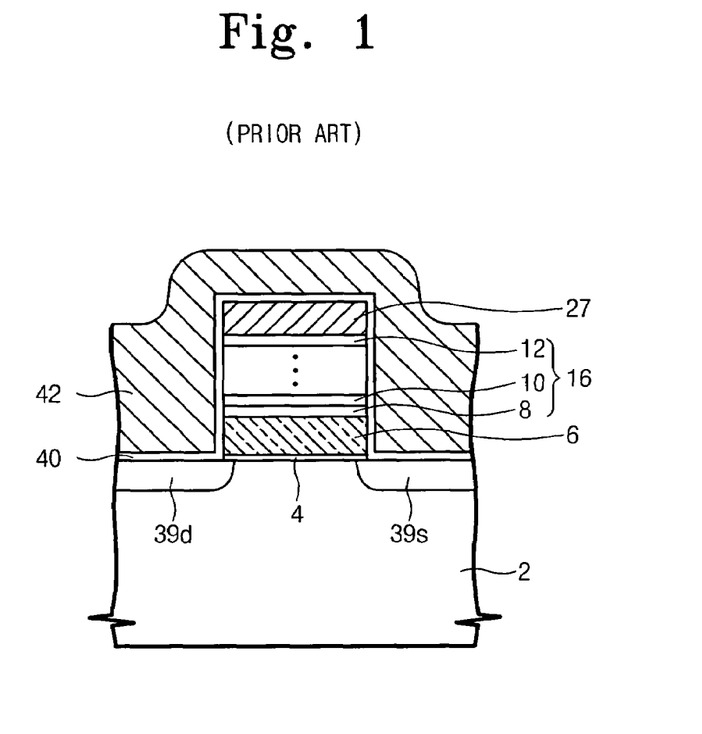
FIG. 1 is a cross-sectional view illustrating a prior art semiconductor memory device having a multi-tunnel junction pattern.
Figure 2:
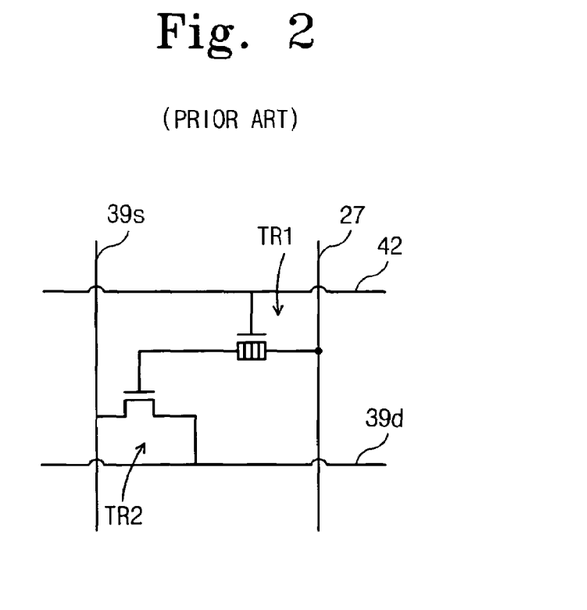
FIG. 2 is a circuit diagram illustrating a unit cell of a prior art semiconductor memory device having a multi-tunnel junction pattern.

Referring to FIGS. 1 and 2, a unit cell of the semiconductor memory device comprises a vertical transistor TR1 and a planar transistor TR2. The planar transistor TR2 has a source region 39s, a drain region 39d and a floating gate 6, where the source/drain regions 39s and 39d are formed in a predetermined region of a semiconductor substrate 2 to be spaced apart from each other and the floating gate 6 is disposed on the channel region between the source and drain regions 39s and 39d. The drain region 39d corresponds to a bit line and the floating gate 6 corresponds to a storage node. A gate insulator 4 is interposed between the storage node 6 and the channel region.

As shown in FIG. 1, a multi-tunnel junction pattern 16 and a data line 27 are sequentially stacked on the storage node 6. The multi-tunnel junction pattern 16 comprises a semiconductor layer 8 and a tunnel insulating layer 10 stacked repeatedly and sequentially. The top layer 12 of the multi-tunnel junction pattern 16 may be one of the semiconductor layers 8 or one of the tunnel insulating layers 10. The data line 27 extends to connect electrically with a plurality of adjacent memory cells (not shown in FIGS. 1 and 2). The storage node 6, the multi-tunnel junction pattern 16 and the data line 27 constitute a multi-layered pattern.

As is also shown in FIG. 1, a gate inter-layer insulator 40 covers the side and top surfaces of the multi-layered pattern. A word line 42 is disposed on the gate inter-layer insulator 40 to cross the data line 27 and other multi-layered patterns. The data line 27, the multi-tunnel junction pattern 16, the storage node 6 and the word line 42 constitute the vertical transistor TR1.

The semiconductor memory cell depicted in FIGS. 1 and 2 operates as follows. First, a data voltage and a write voltage are applied to the data line 27 and the word line 42, respectively, during a writing mode. This acts to form an inversion channel at the sidewalls of the semiconductor layer 8 to generate a tunneling current flowing through the tunnel insulating layer 10. As a result, electric charges such as electrons and holes are stored in the storage node 6 to change the threshold voltage of the planar transistor TR2, where the quantity of electric charges depends on a voltage applied to the data line 27.

Next, for reading data stored in the storage node 6, a reading voltage is applied to the storage node 6 and a suitable voltage, for example the ground voltage, is applied to the source region 39s. If the threshold voltage of the planar transistor TR2 is higher than the reading voltage, the planar transistor TR2 enters a turn-off state, and no current flows through the drain region 39d. On the contrary, if the threshold voltage of the planar transistor TR2 is lower than the reading voltage, the planar transistor TR2 enters a turn-on state and current flows through the drain region 39d. The storage node 6 acts as the gate of the planar transistor TR2 during the reading operation, and the reading voltage applied to the storage node 6 depends on a voltage applied to the word line 42 and a coupling ratio.

According to the above-described prior art, during the writing operation, the threshold voltage of the planar transistor TR2 changes depending on the quantity of electric charges stored in the storage node 6. Meanwhile, the reading operation comprises sensing a quantity of electric charges flowing through the channel region of the planar transistor TR2, where the quantity of electric charges flowing through the channel region of the planar transistor TR2 changes depending upon the threshold voltage of the planar transistor TR2. However, if electric charges stored in the storage node 6 are insufficient, a higher voltage may be needed for the word line in the reading operation. If the voltage applied to the word line is higher, a channel region may be formed in the vertical transistor which may result in leakage of the electric charges stored in the storage node 6.

SUMMARY OF THE INVENTION

Pursuant to embodiments of the present invention, semiconductor memory devices are provided that comprise a plurality of unit memory cells. The unit memory cells may include a first planar transistor in a semiconductor substrate, a vertical transistor disposed on the first planar transistor and a second planar transistor in series with the first planar transistor. The first planar transistor and the second planar transistor may have different threshold voltages. The semiconductor memory device may further include a plurality of word lines. One of these word lines may form the gate of the second planar transistor in a plurality of unit memory cells.

A unit memory cell may also include a storage node. This storage node may act as the gate of the first planar transistor and may also act as the source and/or drain of the vertical transistor. A first planar transistor may include a first conductive region and a second conductive region that define a channel therebetween. The storage node may be on only a first portion of the channel region and not on a second portion of the channel region. In embodiments of the present invention, the portion of the first conductive region adjacent the channel may be only lightly doped as compared to the portion of the second conductive region adjacent the channel. The vertical transistor may comprise the storage node, a multi-junction storage pattern on the storage node, a portion of a data line that is on the multi-junction storage pattern, and a portion of the word line that is on the data line. A capping insulation pattern may also be provided between the data line and the word line.

Pursuant to additional embodiments of the present invention, unit cell semiconductor memory devices are provided. A unit cell is provided on a substrate in which a first conductive region and a second conductive region are formed that are separated by a channel region. The portion of the first conductive region adjacent the channel may be lightly doped while the portion of the second conductive region adjacent the channel may be heavily doped. The unit cells may further include a storage node that is formed solely on a first portion of the channel region, a multi-tunnel junction pattern on the storage node, a data line on the multi-tunnel junction pattern and a word line that covers the data line, the sidewalls of the multi-tunnel junction pattern and the storage node and a second portion of the channel region. The unit cell may also include a gate insulation pattern that is between the storage node and the semiconductor substrate and/or a capping insulation pattern between the data line and the word line.

Pursuant to further embodiments of the present invention, methods of manufacturing a semiconductor memory device are provided. Pursuant to these methods, a storage node and a multi-tunnel junction pattern may be sequentially formed on a first portion of a channel region defined in a semiconductor substrate to form a stacked multi-layered pattern. A data line may be formed on the multi-layered pattern, a gate interlayer insulating layer may be formed on the data line and a word line may be formed on the gate interlayer insulating layer. A capping insulation layer may also be formed on the data line prior to forming the word line, and a gate insulation pattern may be formed on the first portion of the channel region prior to forming the storage node. The word line may also be formed on a second portion of the channel region, and first and second conductive regions may be formed in the semiconductor substrate.

Pursuant to still further embodiments of the present invention, methods of manufacturing semiconductor memory devices are provided in which a first planar transistor and a second planar transistor are formed in series in a semiconductor substrate and a a vertical transistor is formed on the first planar transistor. The step of forming the first planar transistor in the semiconductor substrate may comprise forming a first conductive region and a second conductive region in the substrate to define a channel region and forming a storage node that comprises the gate of the first planar transistor on a portion, but not the entirety, of the channel region. This storage node may also act as either the source and/or the drain of the vertical transistor. A word line of the semiconductor memory device may act as the gate of the second planar transistor.

The semiconductor memory devices according to some embodiments of the present invention may allow performing read operations at relatively low operating voltages and/or may help minimize leakage of charges stored in the storage node.

BRIEF DESCRIPTION OF THE DRAWINGS

FIGS. 6a-12a and FIGS. 6b-12b are cross-sectional views illustrating methods for fabricating semiconductor memory devices according to embodimentss of the present invention.

DETAILED DESCRIPTION

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer or element is referred to as being "on" another layer or substrate, it can be directly on the other layer, element or substrate, or intervening layers and/or elements may also be present. In contrast, when a layer/element is referred to as being "directly on" another layer/element, there are no intervening layers or elements present. Likewise, when an element is described as being "between" two other elements it may be the only element between the two other elements or additional elements may also be present. Like reference numerals refer to like elements throughout.

Figure 3:
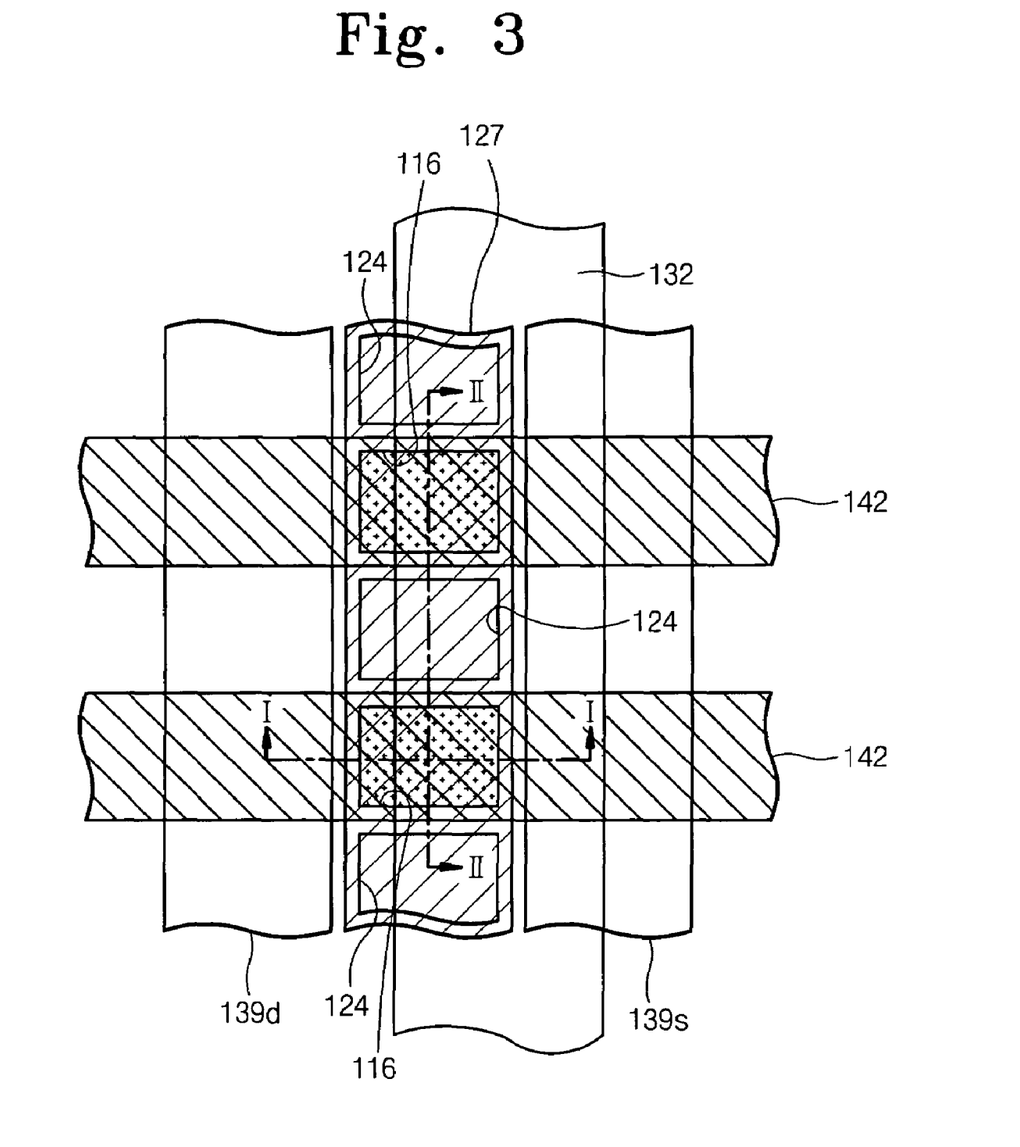
FIG. 3 is a top plan view illustrating a part of a cell array region of a semiconductor memory device according to embodiments of the present invention.
Figure 4A:
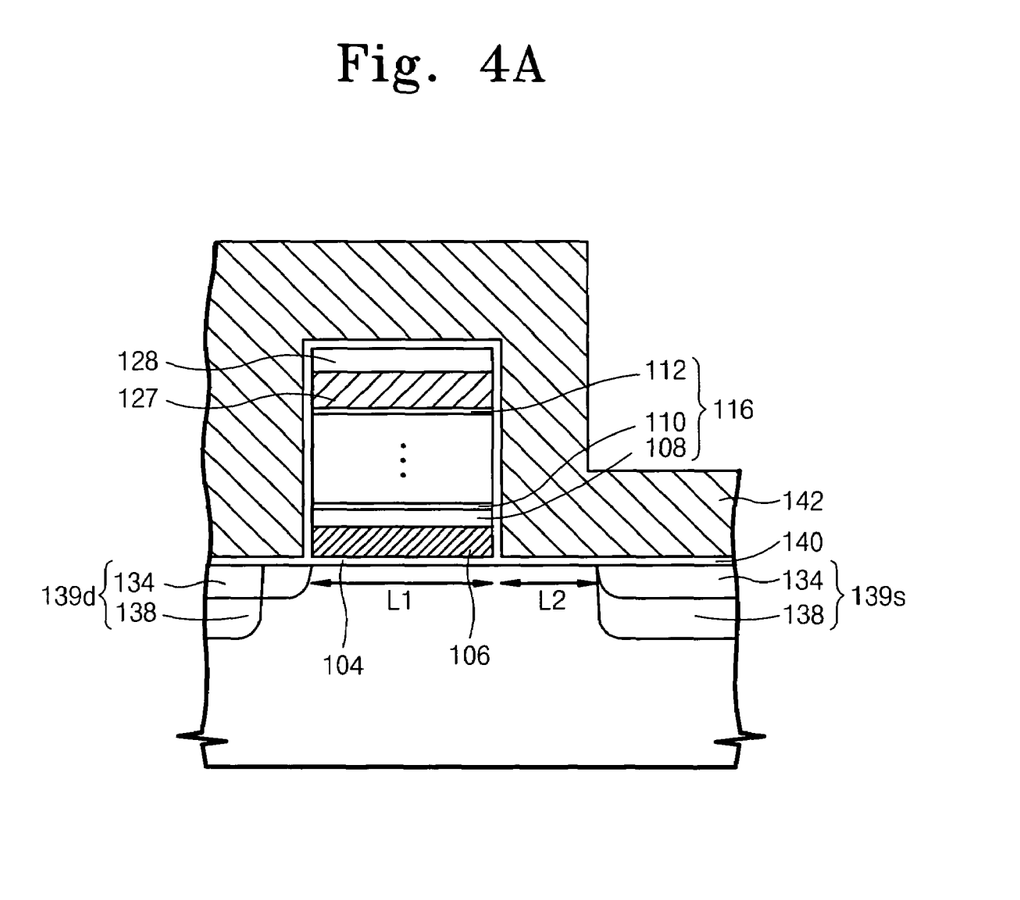
FIG. 4a is a cross-sectional view illustrating a semiconductor memory device taken along the line I-I of FIG. 3.
Figure 4B:
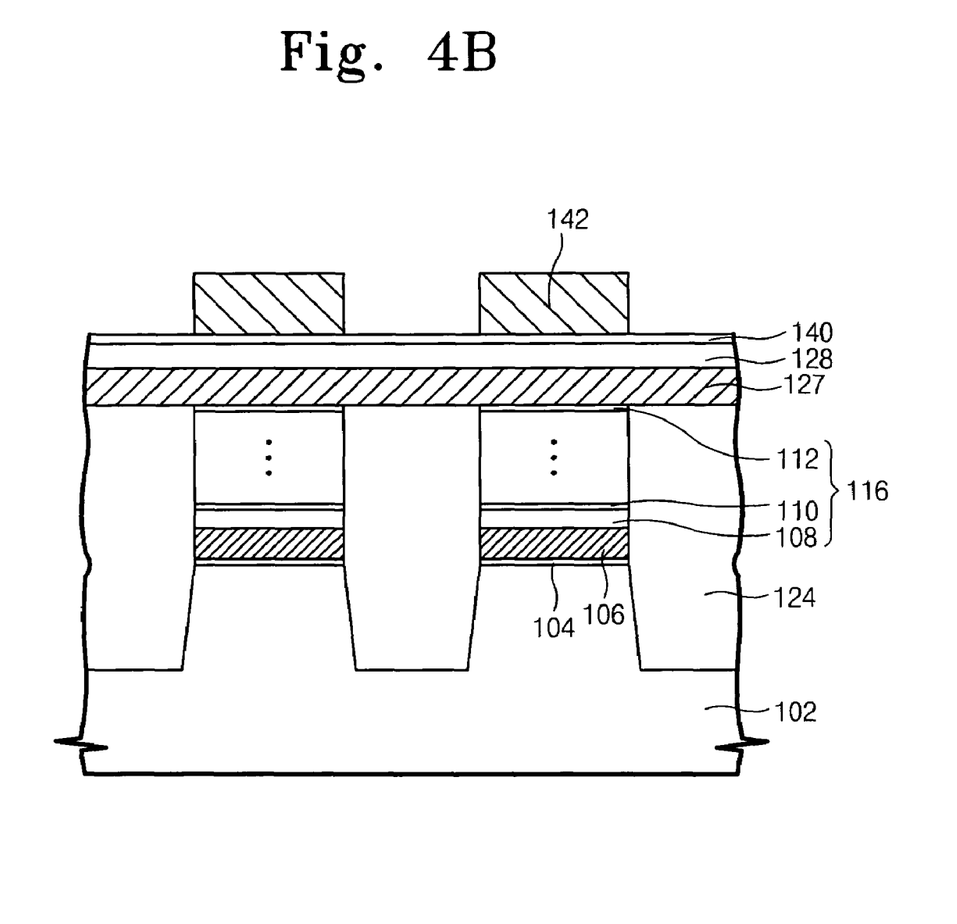
FIG. 4b is a cross-sectional view illustrating a semiconductor memory device taken along the line II-II of FIG. 3.
Figure 5:
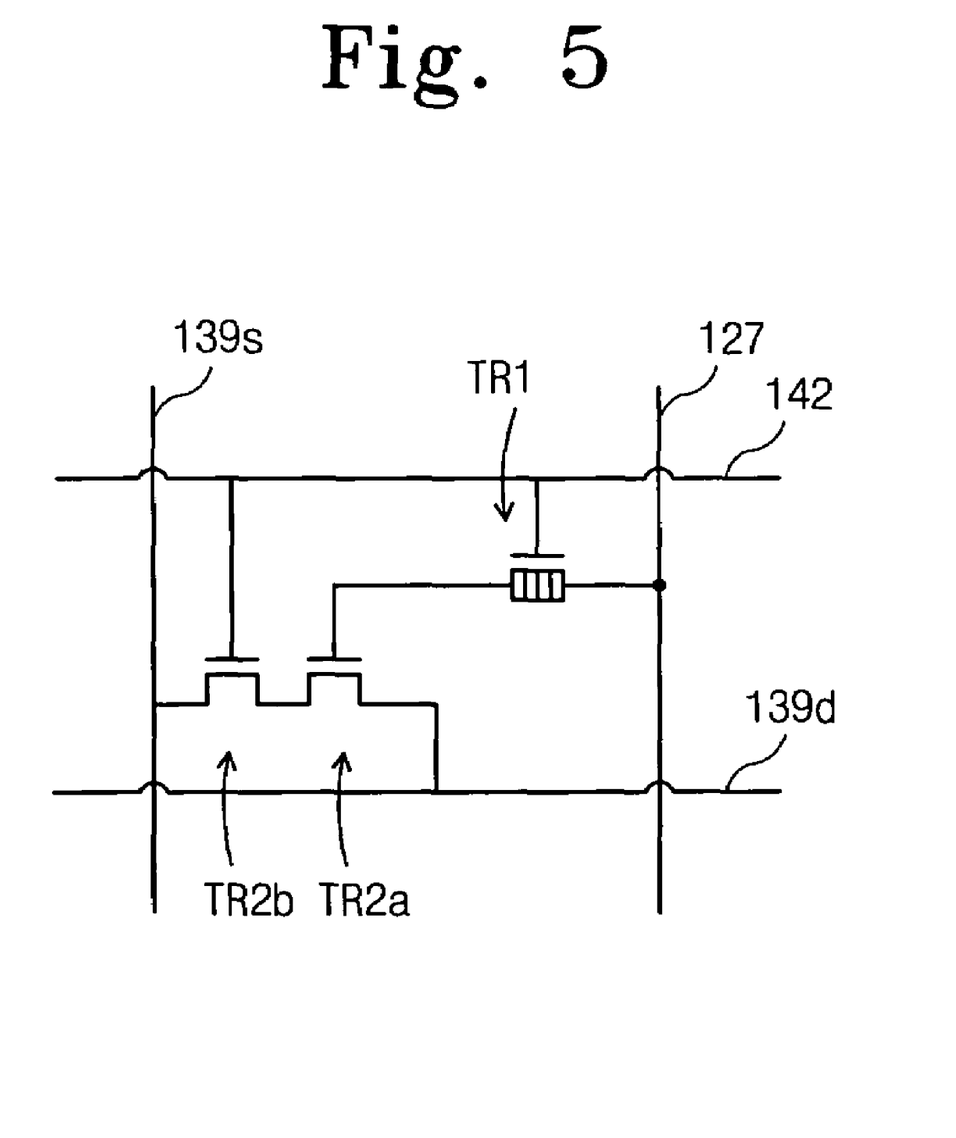
FIG. 5 is a circuit diagram illustrating a unit cell according to embodiments of the present invention.

FIG. 3 is a top plan view illustrating a part of a cell array region of a semiconductor memory device according to embodiments of the present invention. FIGS. 4a and 4b are cross-sectional views of a semiconductor memory device taken along the line I-I and the line II-II, respectively, of FIG. 3. FIG. 5 is a circuit diagram of a unit cell according to embodiments of the present invention Referring to FIGS. 3, 4a, 4b and 5, a first conductive region 139d and a second conductive region 139s are disposed in a predetermined region of a semiconductor substrate 102. The first conductive region 139d and the second conductive region 139s may be parallel to each other. The first and second conductive regions 139d and 139s may be parallel to each other with respect to a specific direction, for example, a row direction. As shown in FIG. 3, a first channel region L1 and a second channel region L2 may be interposed between the first and second conductive regions 139d and 139s. The first conductive region 139d is connected with a sense amplifier (not shown) to be used as a bit line. As shown in FIG. 4B, pluralities of multi-layered patterns are disposed along the column direction on the semiconductor substrate 102 between the first and second conductive regions 139d and 139s. The region between adjacent multi-layered patterns is filled with an isolation pattern 124. As shown in FIG. 4B, the isolation pattern 124 may be extended into the semiconductor substrate 102 to isolate the adjacent multi-layered patterns. Each of the multi-layered patterns may comprise a storage node 106 and a multi-tunnel junction pattern 116 stacked sequentially.

As shown in FIGS. 4a and 4b, each multi-tunnel junction pattern 116 may comprise a plurality of semiconductor layer patterns 108 and tunnel insulating patterns 110. A tunnel insulating pattern 110 may be stacked on each semiconductor layer pattern 108 to form a stacked layer structure. The top layer of the multi-tunnel junction pattern 116 may be the storage node 106 or the multi-tunnel junction pattern 116.

A data line 127 is disposed on the multi-tunnel junction pattern 116 and on the isolation pattern 124 interposed between adjacent multi-tunnel junction patterns 116. Thus, the data line 127 is disposed between the first and second conductive regions 139d and 139s. A capping insulation pattern 128 may be disposed in the data line 127. A plurality of parallel word lines 142 cross over the data line 127. As shown in FIG. 4a, a word line 142 covers both sidewalls of the storage, node 106, both sidewalls of the multi-tunnel junction pattern 116 and the top surface of the second channel region L2. As best shown in FIG. 4a, a conformal gate interlayer insulating layer 140 may be interposed between the word lines 142 and the storage node 106, between the word lines 142 and the multi-tunnel junction pattern 116 and between the word lines 142 and the second channel region L2.

A semiconductor memory device having the above mentioned structure comprises one vertical transistor TR1 and two planar transistors TR2a and TR2b (see FIG. 5). The first planar transistor TR2a comprises the first and second conductive regions 139d and 139s, the first and second channel regions L1 and L2 and the storage node 106. The first and second channel regions L1 and L2 are interposed between the first and second conductive regions 139d and 139s, and the storage node 106 is disposed on the first channel region L1. The vertical transistor TR1 comprises the storage node 106, the multi-tunnel junction pattern 116, the data line 127 and the word line 142. The multi-tunnel junction pattern 116 is disposed on the storage node 106 and the data line 127 may be disposed on the multi-tunnel junction pattern 116 to be parallel with the first and second conductive regions 139d and 139s, while the word line 142 may be disposed across the data line 127 to cover both sidewalls of the storage node 106 and the multi-tunnel junction pattern 116. In some embodiments of the present invention, the word line 142 may be disposed across the second channel region L2 to form the gate electrode of the second planar transistor TR2b. The second planar transistor TR2b is disposed adjacent to the first planar transistor TR2a (see FIG. 5) and on the second channel region L2 to be an offset transistor. A reference number 132 in FIG. 3 denotes a mask pattern that may be used for defining the second channel region L2 of the second planar transistor TR2b.

FIGS. 6a-12a and FIGS. 6b-12b are cross-sectional views illustrating a method for fabricating a semiconductor memory device according to embodiments of the present invention. FIGS. 6a-12a are cross-sectional views taken along the line I-I of FIG. 3 and FIGS. 6b-12b are cross-sectional views taken along the line II-II of FIG. 3.

Figure 6A:
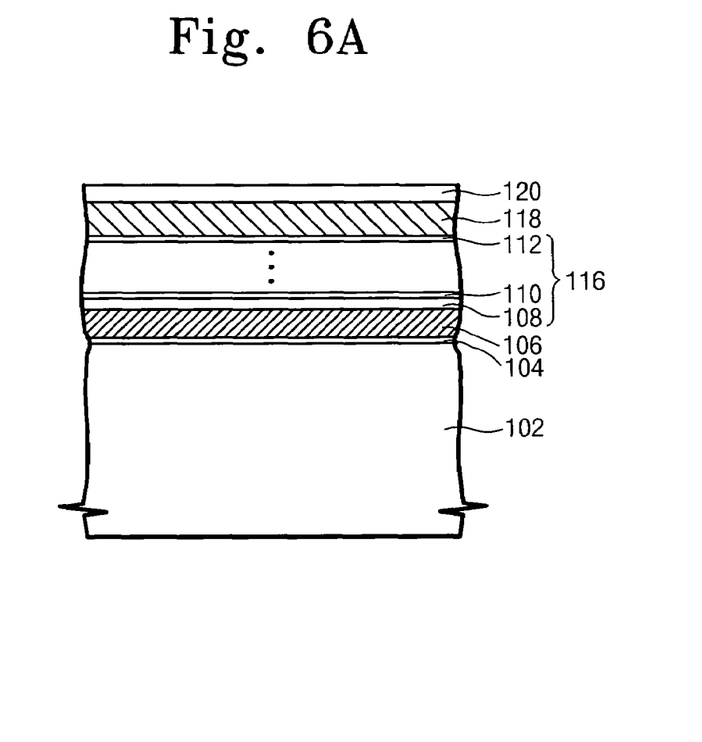
Figure 6B:
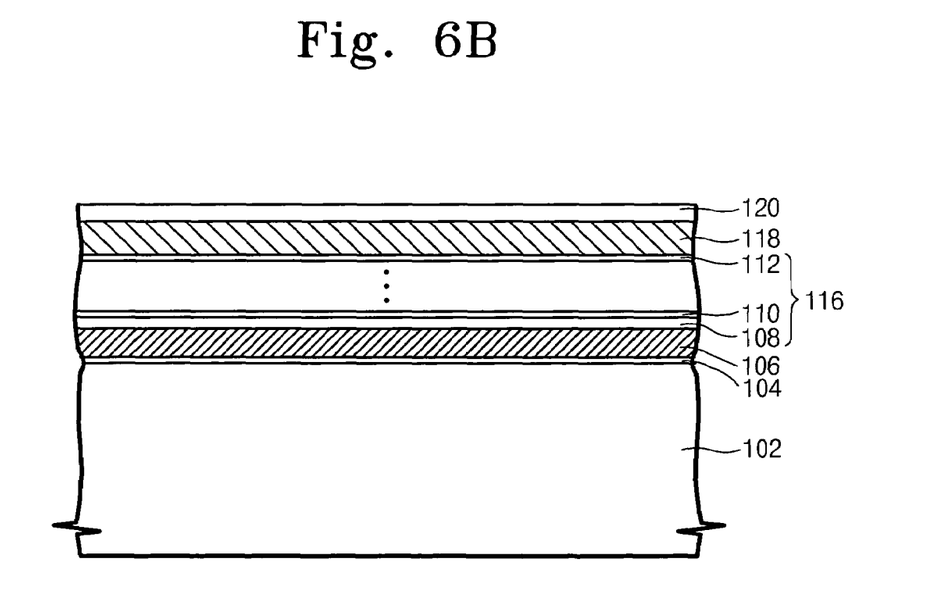

Referring to FIGS. 6a and 6b, a gate insulating layer 104, a storage node layer 106, a multi-tunnel junction layer 116, an upper conductive layer 118 and a polishing preventive layer 120 are sequentially formed on a semiconductor substrate 102. The multi-tunnel junction layer 116 is formed by stacking repeatedly and sequentially a semiconductor layer 108 and a tunnel insulating layer 110. The semiconductor layer 108 may, for example, comprise a silicon layer and the tunnel insulating layer 110 may comprise a silicon nitride layer, a silicon oxynitride layer and/or a silicon oxide layer. The top layer 112 of the multi-tunnel junction layer 116 may be a semiconductor layer 108 or a tunnel insulating layer 110. In embodiments of the present invention, the upper conductive layer 118 may be a doped silicon layer and the polishing preventive layer 120 may be a silicon nitride layer.

Figure 7A:
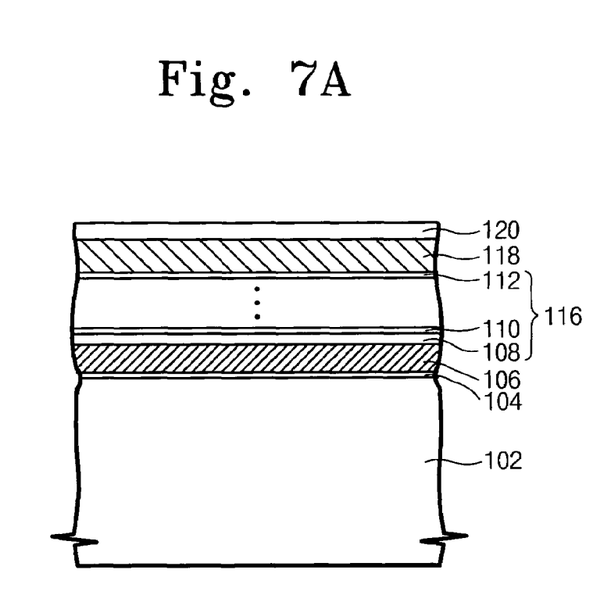
Figure 7B:
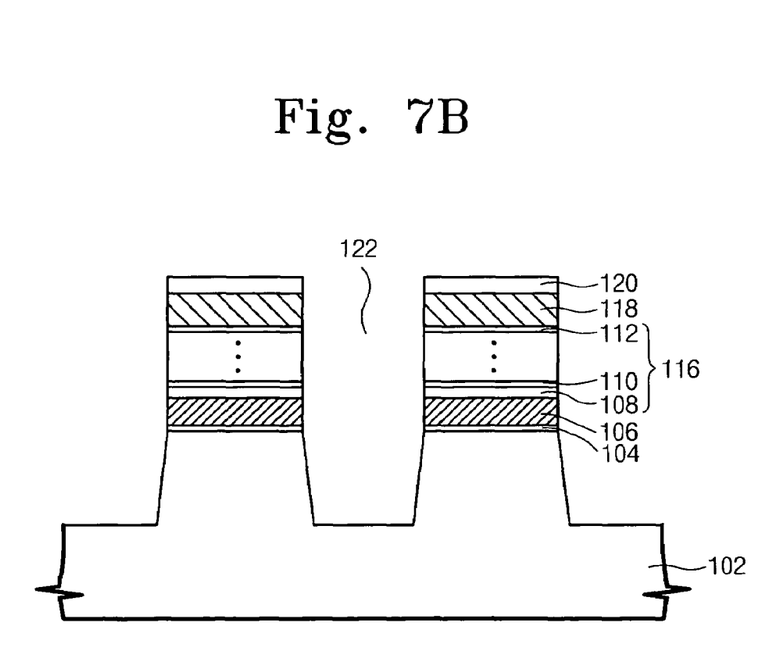

Referring to FIGS. 7a and 7b, the polishing preventive layer 120, the upper conductive layer 118, the multi-tunnel junction layer 116, the storage node layer 106 and the gate insulating layer 104 are sequentially patterned to form openings exposing a predetermined region of the semiconductor substrate 102. The openings are 2-dimensionally arranged with a column direction and a row direction. Next, the exposed semiconductor substrate is etched to form a plurality of trench regions 122. The trench regions are likewise 2-dimensionally arranged to define mesh-shaped active regions.

Figure 8A:
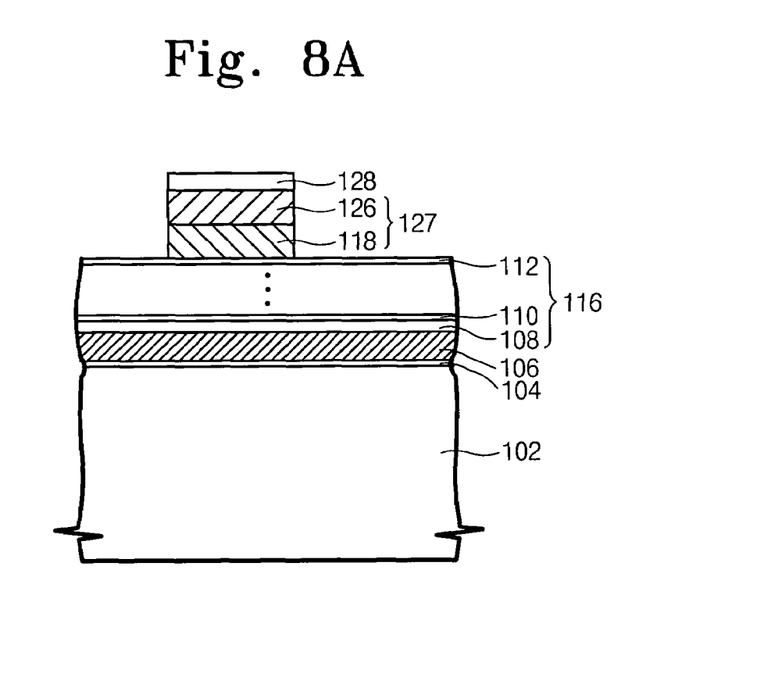
Figure 8B:
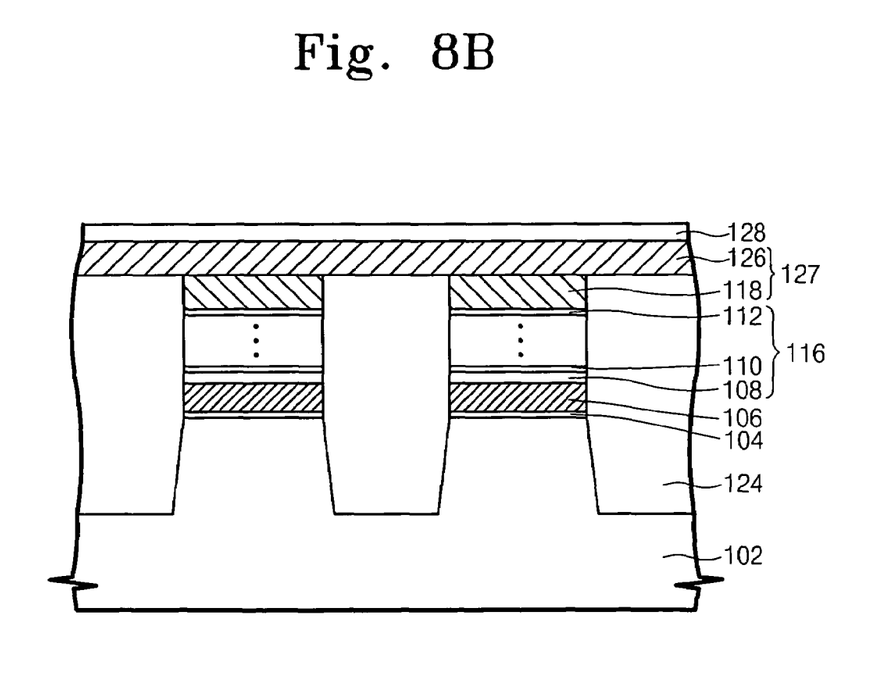

Referring to FIGS. 8a and 8b, an isolating layer is formed on the semiconductor substrate having the trench regions 122 to fill the trench regions 122. The isolating layer is then etched until the polishing preventive layer 120 is exposed, to form a plurality of island-shaped isolating patterns 124 filling the trench regions 122 such that the isolating patterns 124 are also 2-dimensionally arranged along the column and row directions. A chemical-mechanical polishing process may be used for this etching process of the isolating layer. Thereafter, the exposed polishing preventive layer 120 may be removed to expose the upper conductive layer 118.

An interconnecting layer and a capping insulation layer may then be sequentially formed on the resultant structure having the exposed upper conductive layer 118. The interconnecting layer may be, for example, a metal layer, a polycide layer and/or a doped silicon layer, and the capping insulation layer may be, for example, a silicon oxide layer and/or a silicon nitride layer. The capping insulation layer, the interconnecting layer and the upper conductive layer 118 are sequentially patterned to form a plurality of capping insulation patterns 128 and a plurality of data lines 127. Here, the capping insulation patterns 128 are parallel to the row direction and the data lines 127 are disposed beneath the capping insulation patterns 128.

The data lines 127 may cover a predetermined region of the isolating patterns 124 which are placed on row direction lines. As shown in FIGS. 8a and 8b, the data lines 127 may comprise an interconnection line 126 disposed beneath the capping insulation pattern 128 and an upper conductive pattern 118 interposed between the interconnection line 126 and the multi-tunnel junction layer 116. The processing step for forming the upper conductive layer 118 may be omitted, for example, when the interconnecting layer is a doped silicon layer or a polycide layer.

Figure 9A:
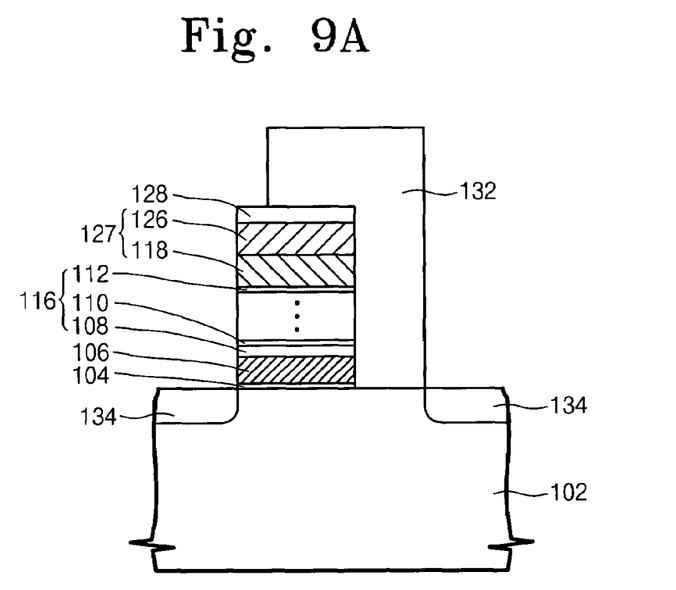
Figure 9B:
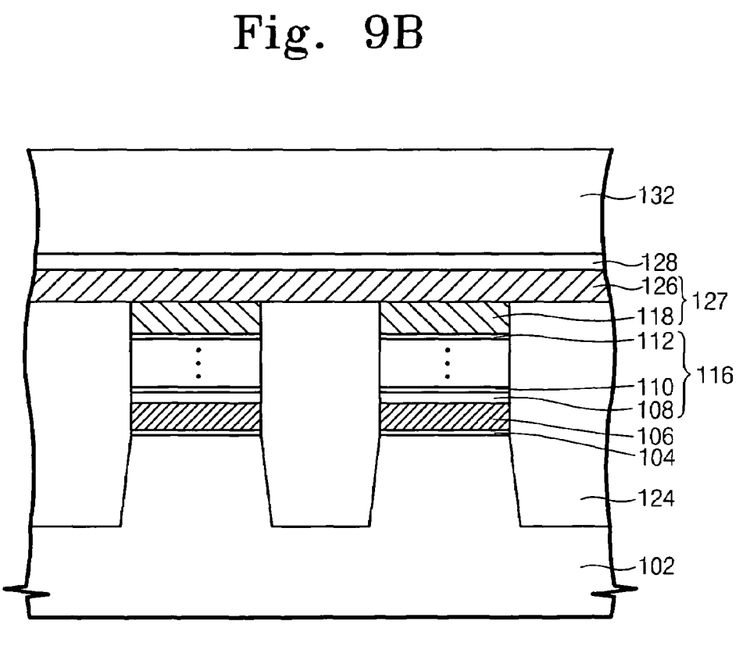

Referring to FIGS. 9a and 9b, the exposed multi-tunnel junction layer 116 between the data lines 127 is etched to form a plurality of multi-tunnel junction patterns 116. The multi-tunnel junction patterns 116 are disposed among the isolating patterns 124 and beneath the data lines 127. As shown in FIGS. 9a and 9b, the multi-tunnel junction pattern 116 comprises a semiconductor pattern 108 and a tunnel insulating pattern 110 stacked repeatedly and sequentially. The storage node layer 106 and the gate insulating layer 104 are also sequentially etched to form a storage node pattern 106 under the multi-tunnel junction patterns 116 and a gate insulating pattern 104 under the storage node patterns 106.

An ion implantation process using the stack-type multi-patterns as a mask may be performed in order to adjust a threshold voltage of the second planar transistor TR2b.

A first mask pattern 132 defining a second channel region may then be formed after the ion implantation process (if any) for adjusting a threshold voltage of the second planar transistor TR2b has been performed. Another ion implantation process using the first mask pattern 132 as a mask may then be performed to form a lightly doped region 134 in the semiconductor substrate 102. As shown in FIG. 9a, during this ion implantation process the first mask pattern 132 covers the second channel region in order to minimize and/or prevent any change to the threshold voltage of the second planar transistor TR2b.

Figure 10A:
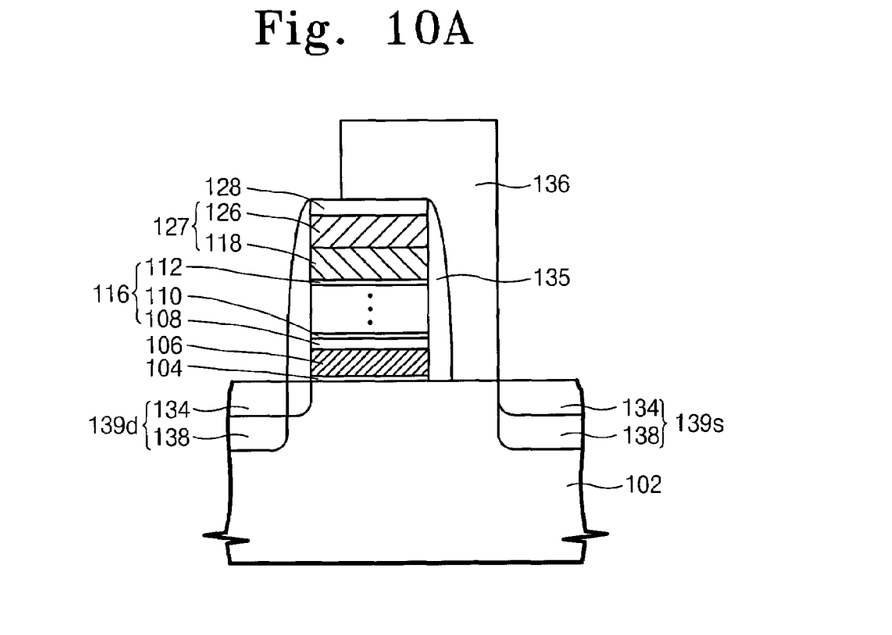
Figure 10B:
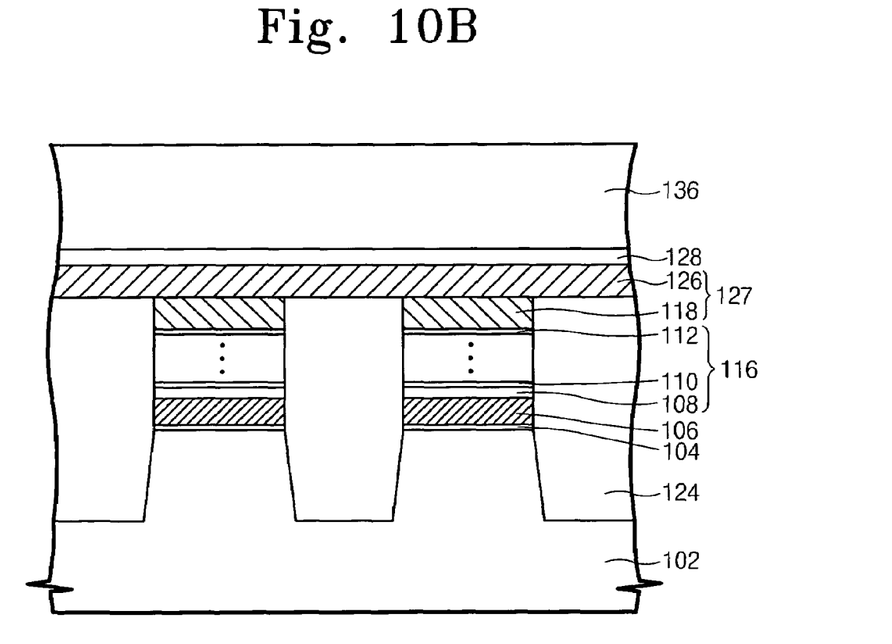

Referring to FIGS. 10a and 10b, the first mask pattern 132 may be removed and a spacer insulating layer may then be conformally formed on the substrate. The spacer insulating layer may then be anisotropically etched to form a spacer 135 on the sidewalls of the multi-tunnel junction patterns 116. Subsequently, a second mask pattern 136 may be formed on a predetermined region of the semiconductor substrate 102. A heavily doped region 138 is formed in the semiconductor substrate via an ion implantation process using the spacer 135, the multi-tunnel junction patterns 116 and the second mask pattern 136 as an ion implantation mask. The lightly doped drain region 134 and the heavily doped region 138 constitute a first conductive region 139d and a second conductive region 139s.

Figure 11A:
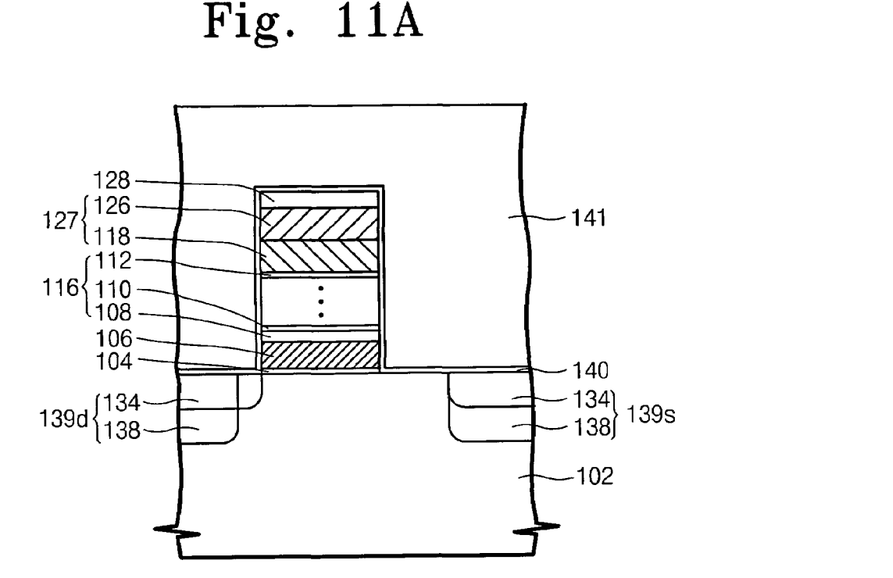
Figure 11B:
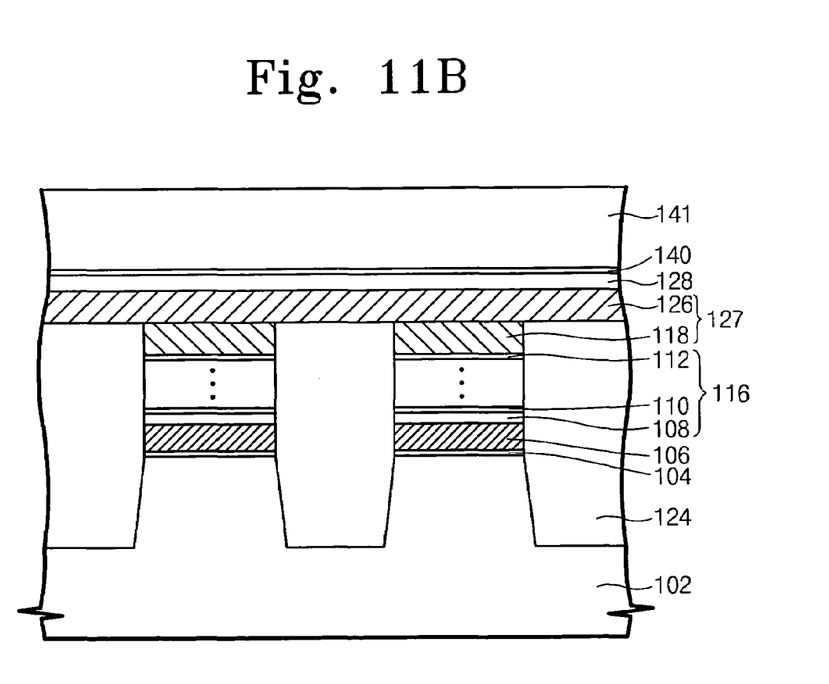

Referring to FIGS. 11a and 11b, a gate interlayer insulating layer 140 may be conformally formed on the resultant structure having the first and second conductive regions 139d, 139s. The gate interlayer insulating layer 140 may be formed, for example, of a silicon oxide layer or a silicon nitride layer or a combination thereof. An etch stop layer (not shown), such as a silicon nitride layer, may also be formed on the gate interlayer insulating layer 140. An interlayer dielectric 141 may then be formed on the semiconductor substrate having the gate interlayer insulating layer 140 and the etch stop layer.

Figure 12A:
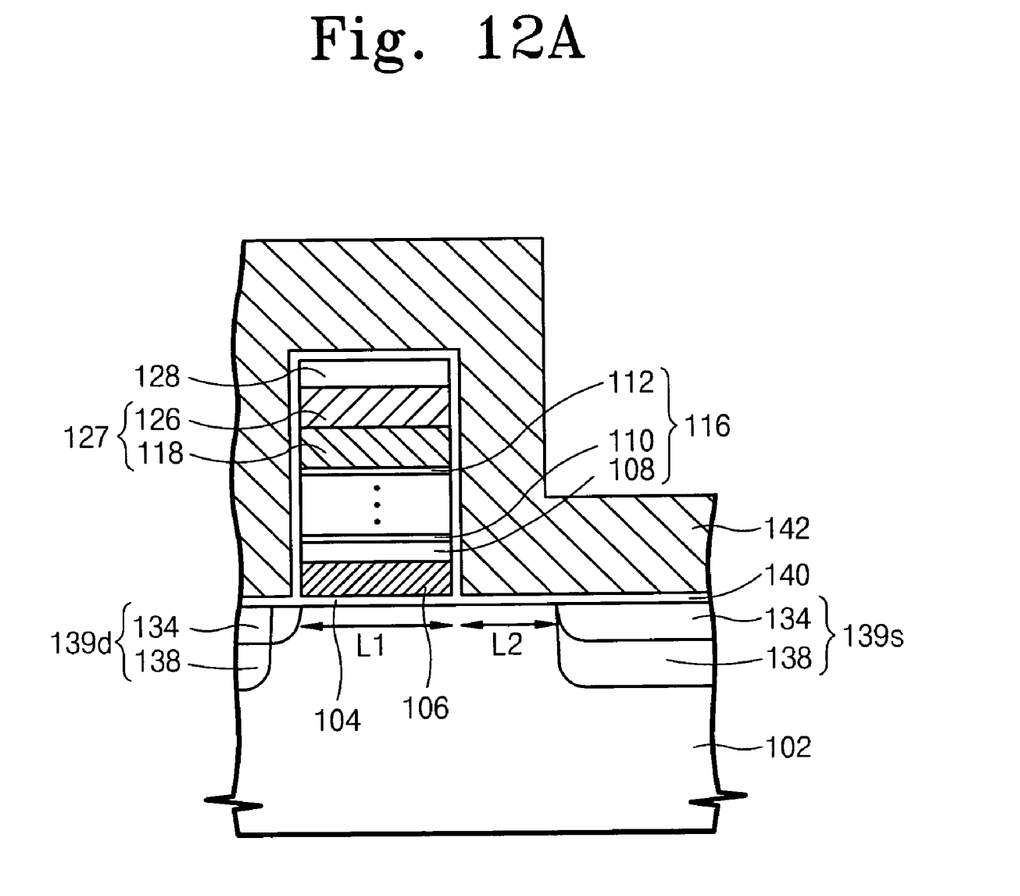
Figure 12B:
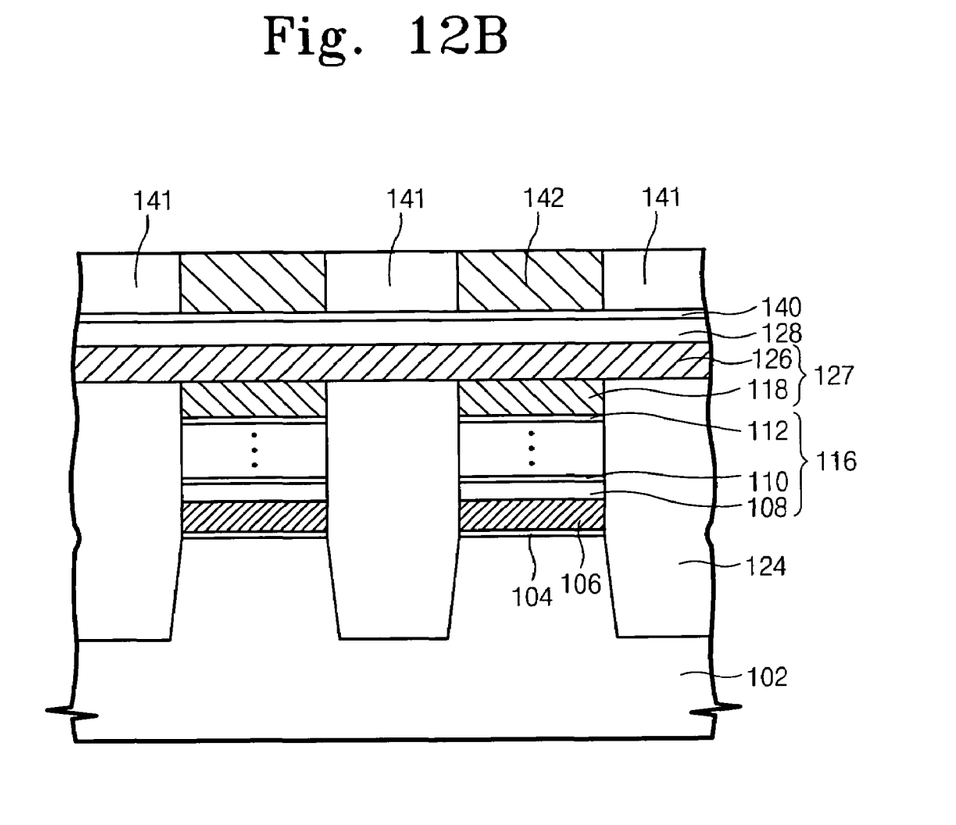

Referring to FIGS. 12a and 12b, the interlayer dielectric 141 is patterned so that the etch stop layer is exposed. Thus, a plurality of grooves are formed in the interlayer dielectric 141 that cross over the data lines 127. The exposed etch stop layer is etched to expose the gate interlayer insulating layer 140. A plurality of word lines 142 are formed in the grooves by performing a conventional damascene process. Each of the word lines 142 may cover both sidewalls of the storage nodes 106, both sidewalls of the multi-tunnel junction patterns 116 and the top surface of the second channel region L2. The word lines 142 are disposed across the second channel region L2 and form the gate electrode of the second planar transistor. The reference index L1 in FIG. 12a denotes the first channel region.

According to some embodiments of the present invention, due to the offset transistor, the operation voltage of a semiconductor memory device can be decreased during a reading procedure. As noted above, the storage node may act as the gate electrode of the first planar transistor and as the source region of the vertical transistor. During a reading operation, the voltage of the word line is adjusted by a coupling ratio and is applied to the first planar transistor as a read voltage, while the voltage of the word line is directly applied to the second planar transistor. Therefore, leakage of electric charges in a storage node may be reduced, because a relatively low voltage may be applied to the word line.

Additionally, the reading procedure of the semiconductor memory device can be effectively performed by controlling the threshold voltages of two planar transistors.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A semiconductor memory device, comprising:
a plurality of unit memory cells, wherein a unit memory cell comprises:
  a first planar transistor in a semiconductor substrate;
  a vertical transistor disposed on the first planar transistor;
  a second planar transistor in the semiconductor substrate, wherein the second planar transistor is electrically connected in series with the first planar transistor;
  first and second conductive regions formed in the semiconductor substrate to define a channel region;
  a storage node, a multi-junction storage pattern that has first and second sidewalls and a data line, which are sequentially stacked on the semiconductor substrate; and
  a word line crossing over the data line and on both the first and second sidewalls of the multi-junction storage pattern.

2. The semiconductor memory device of claim 1, wherein the first planar transistor comprises the storage node, the first and second conductive regions and the channel region, the vertical transistor comprises the word line, the storage node, the data line and the multi-junction storage pattern, and the second planar transistor comprises the word line, the first and second conductive regions and the channel region.

3. The semiconductor memory device of claim 2, wherein the word line is used as both a gate of the second planar transistor and a gate of the vertical transistor.

4. The semiconductor memory device of claim 2, wherein the word line is configured to connect the second planar transistors and vertical transistors of the unit memory cells along a direction perpendicular to the data line.

5. The semiconductor memory device of claim 2, wherein the data line is an electrode of the vertical transistor, which is used to supply the storage node with electric charges or to drain electric charge from the storage node.

6. The semiconductor memory device of claim 2, wherein the data line is configured to connect the vertical transistors of the unit memory cells along a direction perpendicular to the word line.

7. The semiconductor memory device of claim 1, a portion of the first conductive region adjacent the channel is lightly doped as compared to a portion of the second conductive region adjacent the channel.

8. The semiconductor memory device of claim 2, wherein the first and second planar transistors are connected in series with the first and second conductive regions.

9. The semiconductor memory device of claim 2, wherein the channel region comprises a first channel region and a second channel region, and wherein the first planar transistor is disposed on the first channel region and the second planar transistor is disposed on the second channel region.

10. The semiconductor memory device of claim 1, further comprising a capping insulation pattern disposed on the data line, the capping insulation pattern separating the data line from the word line.

11. The semiconductor memory device of claim 1, wherein the first planar transistor and the second planar transistor have different threshold voltages.

12. A semiconductor memory device, comprising:
a source region and a drain region in a semiconductor substrate;
a gate that is laterally offset from at least one of the source region and the drain region and provided on the substrate between the source region and the drain region, wherein the gate comprises the gate of a first planar transistor in the semiconductor substrate;
a vertical transistor on the gate, wherein the vertical transistor comprises the gate which acts as a storage node, a multi-junction storage pattern that has first and second sidewalls, a data line, and a word line which crosses over the data line and which is on both the first and second sidewalls of the multi-junction storage pattern, which are sequentially stacked on the semiconductor substrate; and
a second planar transistor in the semiconductor substrate that is electrically connected in series with the first planar transistor.

13. The semiconductor memory device of claim 12, wherein the storage node comprises a source/drain region of the vertical transistor.

14. The semiconductor memory device of claim 1, wherein a channel region of the second planar transistor comprises a portion of a channel region of the first planar transistor.

15. The semiconductor memory device of claim 1, wherein the first planar transistor and the second planar transistor share a common source/drain region.

16. The semiconductor memory device of claim 12, wherein the word line is used as both a gate of the second planar transistor and a gate of the vertical transistor.

17. The semiconductor memory device of claim 16, wherein the data line is an electrode of the vertical transistor, which is used to supply the storage node with electric charges or to drain electric charge from the storage node.

18. The semiconductor memory device of claim 16, wherein the data line is configured to connect the vertical transistors of the unit memory cells along a direction perpendicular to the word line.

19. The semiconductor memory device of claim 16, wherein the source region and the drain region define a channel region that comprises a first channel region and a second channel region,
wherein the first planar transistor is disposed on the first channel region and the second planar transistor is disposed on the second channel region.

20. The semiconductor memory device of claim 12, further comprising a capping insulation pattern disposed on the data line, the capping insulation pattern separating the data line from the word line.

21. The semiconductor memory device of claim 12, wherein the first planar transistor and the second planar transistor have different threshold voltages.

* * * * *

UNITED STATES PATENT AND TRADEMARK OFFICE
CERTIFICATE OF CORRECTION

PATENT NO. : 7,282,761 B2 Page 1 of 1
APPLICATION NO. : 10/696615
DATED : October 16, 2007
INVENTOR(S) : Ahn et al.

It is certified that error appears in the above-identified patent and that said Letters Patent is hereby corrected as shown below:

On Title Page:

Sec. (54): Should read --SEMICONDUCTOR MEMORY DEVICES HAVING

OFFSET TRANSISTORS--

Column 1, lines 1-3: Please correct title to read --SEMICONDUCTOR MEMORY

DEVICES HAVING OFFSET TRANSISTORS--

Signed and Sealed this

Twenty-fifth Day of December, 2007

JON W. DUDAS
*Director of the United States Patent and Trademark Office*